(12) United States Patent
John

(10) Patent No.: US 7,041,906 B2
(45) Date of Patent: May 9, 2006

(54) FLAT FLEX CABLE

(75) Inventor: Wolfgang John, Eisenstadt (AT)

(73) Assignee: I & T Innovation Technology Entwicklungs - und Holding AG, Eisenstadt (AT)

(*) Notice: Subject to any disclaimer, the term of this patent is extended or adjusted under 35 U.S.C. 154(b) by 0 days.

(21) Appl. No.: 10/723,128

(22) Filed: Nov. 25, 2003

(65) Prior Publication Data

US 2004/0149488 A1 Aug. 5, 2004

(30) Foreign Application Priority Data

Nov. 26, 2002 (EP) ................................. 02450268

(51) Int. Cl.
*H01B 5/03* (2006.01)
(52) U.S. Cl. .................. 174/68.1; 174/68; 174/53; 174/117 F; 174/117 FF; 174/261; 174/117 A; 174/72 C; 439/15; 439/164; 29/830
(58) Field of Classification Search .................. 174/53, 174/117 F, 117 FF, 261, 68, 68.1, 117 A, 174/72 C; 439/15, 164; 29/830
See application file for complete search history.

(56) References Cited

U.S. PATENT DOCUMENTS

| | | | |
|---|---|---|---|
| 5,780,773 A * | 7/1998 | Wakamatsu | 174/72 C |
| 6,222,131 B1 * | 4/2001 | Schilson | 174/117 FF |
| 6,372,992 B1 * | 4/2002 | Yang | 174/117 F |
| 6,392,148 B1 * | 5/2002 | Ueno et al. | 174/72 A |

* cited by examiner

*Primary Examiner*—Dean A. Reichard
*Assistant Examiner*—Anton Harris
(74) *Attorney, Agent, or Firm*—Merchant & Gould

(57) ABSTRACT

The invention pertains to a flat flex cable (1) or a so-called FFC, in particular for use in vehicles, wherein said cable contains at least two electric conductors (2) that are surrounded by an insulating layer (3) of a plastic material.

Figure 1:
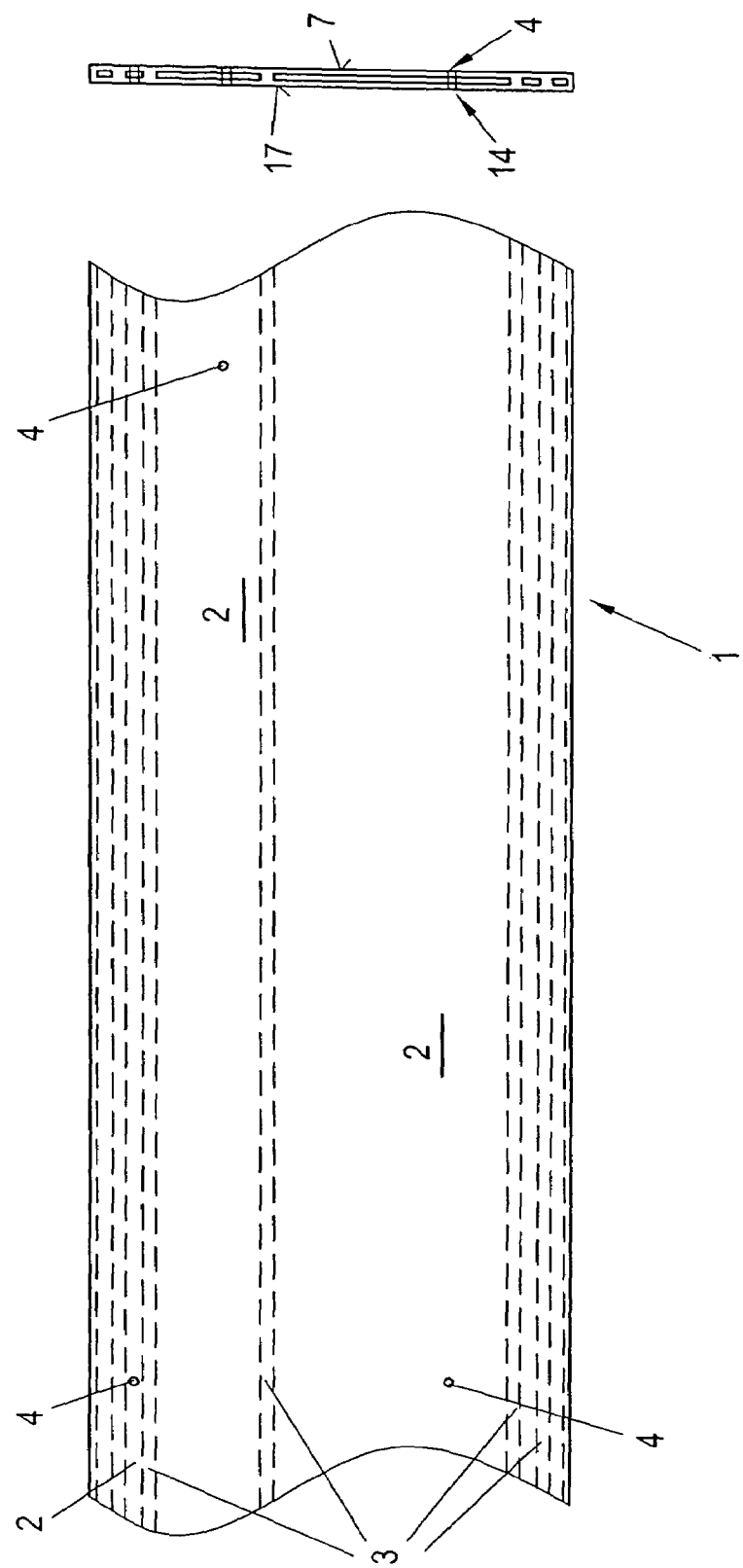

The invention is characterized by the fact that electronic components (11) are arranged on a circuit layout (6) on the surface of the flat flex cable (1) and connected to at least one conductor (2) of the flat flex cable.

The invention also pertains to a method for manufacturing such an FFC.

7 Claims, 7 Drawing Sheets

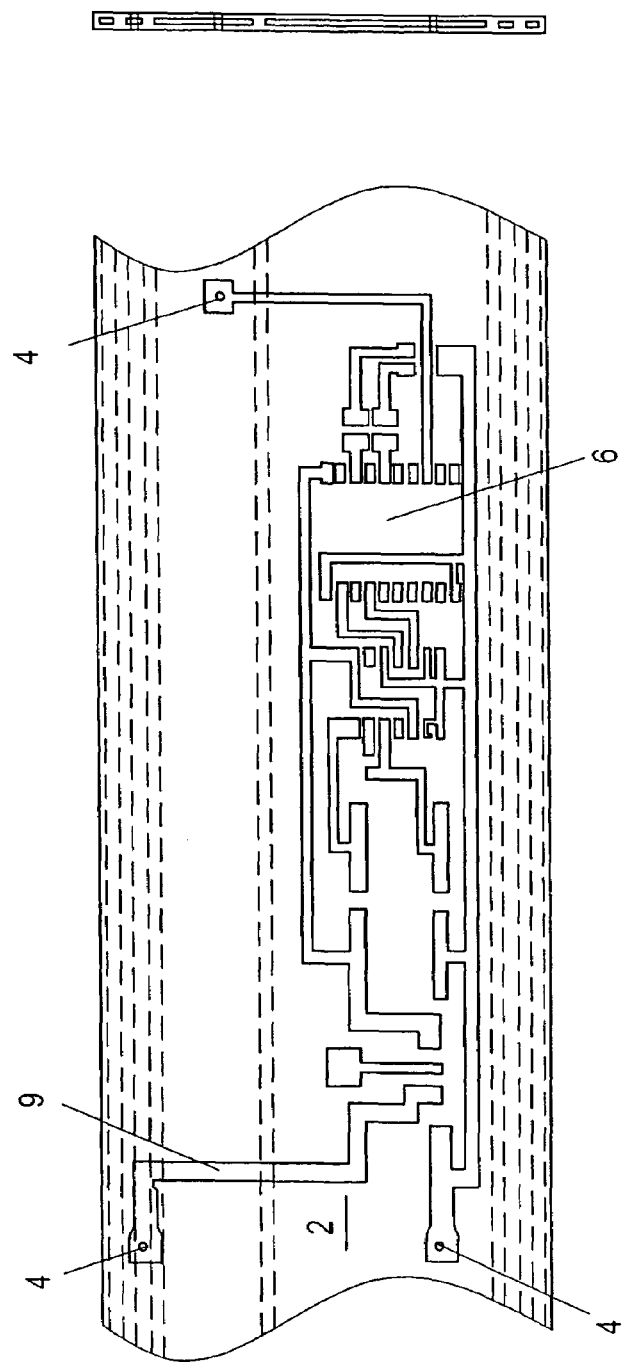
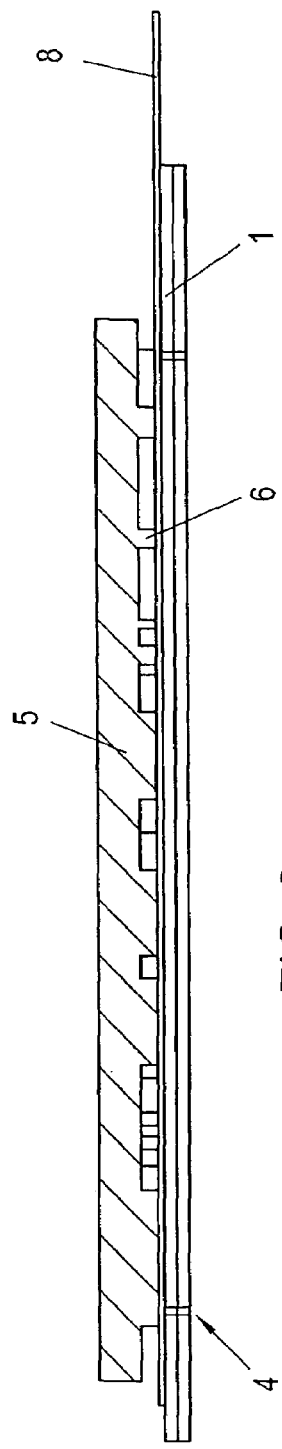
FIG. 2
FIG. 3

FLAT FLEX CABLE

The invention pertains to flat-conductor cables or so-called flat flex cables (FFCs), in particular for use in vehicles, wherein said cables contain at least two electric conductors that are surrounded by an insulating layer of a plastic material.

Flat flex cables of this type are generally known and increasingly utilized instead of classic round-conductor cables in applications in which the structural space is strictly limited. The cabling expenditure, in particular, in the automotive industry, has significantly increased due to the rapidly growing number of electronic safety and convenience functions, despite intelligent BUS technologies. Flat flex cables would make it possible to reduce the structural volume, particularly with respect to the planned introduction of a 42 V on-board network and the possible reduction of the conductor cross sections in such a network. Another advantage is that, in contrast to conventional (twisted) round-conductor cables, FFCs can be installed and manipulated with a handling gear or a so-called robot.

Flat flex cables suitable for the automotive industry are manufactured by hot-laminating two thermoplastic plastic films that are coated with an adhesive, wherein parallel metal strips that are spaced apart from one another by a defined distance are positioned between the plastic films. Alternatively, cables of this type are manufactured by coating parallel metal strips with thermoplastic plastic materials in an extrusion process.

Flat flex cables may also be produced with techniques known from the manufacture of printed circuit boards, e.g., by providing endless copper-laminated films with a strip-shaped etching mask in the form of the subsequent strip conductor patterns and then etching away the unneeded copper in a continuous operation. Subsequently, an insulating film is laminated over the structured strip conductors or a thermally-hardenable or UV-hardenable cover lacquer is printed over the entire surface of the strip conductors and, if so required, recessed accordingly.

Independently of the manufacturing method and consequently the design of the cable, this description and the claims only refer to at least one layer of an electrically insulating material or plastic material that surrounds the conductors because the aforementioned differences are inconsequential for the invention.

The thusly manufactured flat flex cables are usually utilized as electric lines that are connected to the respective electric/electronic components, e.g., control devices, power supply, switches, power consumers, etc., if applicable, by means of separable plug-type connections.

The quantity of these plug-type connections inevitably increases with the growing number of electronic items in vehicles and the number of required flat flex cables. In the automotive industry, these plug-type connections must conform to high quality standards with respect to their service life and electric integrity under changing climatic and vibrational stresses. In this respect, plug-type connections of this type have increasingly proved to be expensive, voluminous, and ultimately limited with respect to their reliability.

Based on this state of the art, the invention aims to reduce the number of required plug-type connectors and to thusly achieve a superior reliability in comparison with the state of the art without increasing the structural space.

According to the invention, these objectives are attained due to the fact that electric and/or electronic components are arranged on a circuit layout on the surface of the flat flex cable and connected to at least one conductor of the flat flex cable.

For this purpose, the plastic surface of the cable is provided with a circuit layout including the corresponding electronic components (surface circuit), and at least one electrically conductive connection between the electronic components and at least one conductor of the flat flex cable is produced. The surface circuit can be fitted with active and/or passive electronic components and/or sensors. In addition, the surface circuit may serve as a contact surface for switches.

A circuit structure (strip conductors) preferably is stamped on at least one side of the electrically insulating plastic layer of the cable, preferably by means of a hot-stamping process.

EP 0 063 347 A and DE 198 57 157 A, the content of which is incorporated into the present description by reference, describes the manufacture of a copper foil that is superbly suited for use as the circuit structure according to the invention. One characteristic of this galvanically-produced copper foil is the formation of a special microstructure with low transverse strength. This microstructure of the foil makes it possible for a heated stamping die, with the strip conductor pattern in the form of a raised contour, to punch (separate) the circuit structure out of the foil and to simultaneously stamp the copper strip conductors on plastic surfaces, in this case, the flat conductor.

This stamping technique is already known and, for example, used for manufacturing injection-molded circuit carriers (3-D MID, Molded Interconnect Devices) and explicitly described in the handbook "Herstellungsverfahren, Gebrauchsanforderungen und Materialkennwerte Räumlicher Elektronischer Baugruppen 3-D MID [Manufacturing Methods, Application Requirements and Material Characteristics of Three-Dimensional Electronic Assembly Groups 3-D MID]," published by Forschungsvereinigung Räumliche Elektronische Baugruppen 3-D MID e.V., D-Erlangen, 2nd Edition, November 1999, Chapter 9.2.2.

The metal stamping foil advantageously has a rough structure on the side that faces the flat flex cable to be stamped, e.g., a so-called cauliflower structure (as described in DE 198 57 157 A). The metal stamping foil preferably is also provided with a black oxide coating. This black oxide coating is applied by means of rinsing in a currentless black oxidation bath as is customarily utilized for the treatment of printed circuit boards in the state of the art. In this case, it is possible to utilize the technology described in Hermann, G.: "Handbuch der Leiterplattentechnik [Handbook of Printed Circuit Technology]," Eugen Leuze Verlag, Saulgau/Württ., 1982. After the stamping process, this so-called "treatment" results in an excellent adhesion of the stamped metal structure on thermoplastic substrates, namely because the surface of the plastic material which liquefies during the stamping process flows into the structure and is rigidly anchored therein after it cools.

In order to subsequently produce an electrical connection between the circuit structure stamped on the insulation of the flat flex cable and at least one conductor, at least one window opening, preferably several window openings, is/are arranged in the insulation of the flat conductor before the stamping process. For example, $CO_2$ laser systems that burn away the insulating plastic material situated above the flat strip conductors in a defined fashion may be utilized for this purpose. It would also be conceivable to remove the insulation with mechanical methods, e.g., scraping or cutting.

In order to obtain the flat conductor according to the invention with its surface circuit structure, the circuit layout or the stamping contour of the stamping die, is realized such that a section of the strip conductors can be stamped over the previously produced windows, namely either on the end of the strip conductor or at an arbitrary location situated within the strip conductor.

In the next step, the conductor pattern is punched out of a commercially available copper foil that preferably has a thickness between 12 and 120 μm and was subjected to the aforementioned "treatment" on the stamping side, namely with the aid of a heated stamping die that is subjected to a certain pressure, wherein the conductor pattern is simultaneously stamped on the insulation of the cable. The temperature and pressure conditions depend on the type and the thickness of the plastic insulating material of the flat conductor, the size of the circuit layout to be stamped on, and the thickness of the strip conductor structure. The thickness of the foil used for the stamping process depends, in turn, on the desired current conducting capacity of the electronic circuit that is subsequently realized on the flat conductor.

After the stamping process, the foil lies on top of the exposed strip conductors of the flat conductor at the locations at which windows were previously produced in the insulation of the cable and on which the layout is stamped, namely because no plastic material is situated underneath these locations. At these locations, the strip conductor layout is realized such that a border with a width of approximately 0.5 mm is stamped around the insulation window.

If the insulation is also removed on the other side of the flat conductor, i.e., on the underside of the locations for producing the connection between the surface circuit and the conductors of the cable, it is surprisingly possible to produce the connection by means of resistance welding, namely by contacting the flat cable with one welding electrode and contacting the stamped strip conductor with the other welding electrode. An electric connection in the form of a welded connection is produced by pressing together the electrodes and applying a current pulse.

In one embodiment of the invention, the circuit layout can also be stamped directly adjacent to insulation windows, wherein the electric connection between the stamped circuit layout and the strip conductors in the flat conductor is subsequently produced by means of wire bonding techniques. Depending on the wire bonding technique, preparation of the surface of the stamped strip conductors may be required, preferably in the region in which the bonding is subsequently carried out, as well as the surfaces of the strip conductors which are exposed due to the windows in the insulation of the cable, namely with conventional chemical or electrochemical methods.

These locations can be protected from environmental influences, in particular, after the bonding and, if so required, after the welding of the connections, e.g., by means of dispensing or open casting with a thermally-hardenable, chemically-hardenable or UV-hardenable casting resin, the chemical structure of which should ensure an excellent adhesiveness on the insulation material of the flat conductor. A person skilled in the art is familiar with an assortment of suitable casting resins.

The flat flex cable that now contains a strip conductor surface structure with at least one electrically conductive connection to the strip conductors in the cable can be fitted with electronic components at this point. Since the thermoplastic insulating materials used for the manufacture of such cables usually cannot withstand conventional reflow soldering temperatures, it is practical to utilize selective soldering methods, e.g., laser soldering or light soldering, for the fitting of the electronic components. Alternatively, it would also be conceivable to utilize conductive bonding techniques or solders with a low melting point.

The fitted flat flex cables can then be protected from external influences in the region of the circuits, e.g., with housing shells, by means of selective casting or a coat of protective lacquer.

It is also possible to arrange electronic components or even plug connectors, switches or the like on or in the housing such that an additional integration of the cabling is realized.

Figure 4:
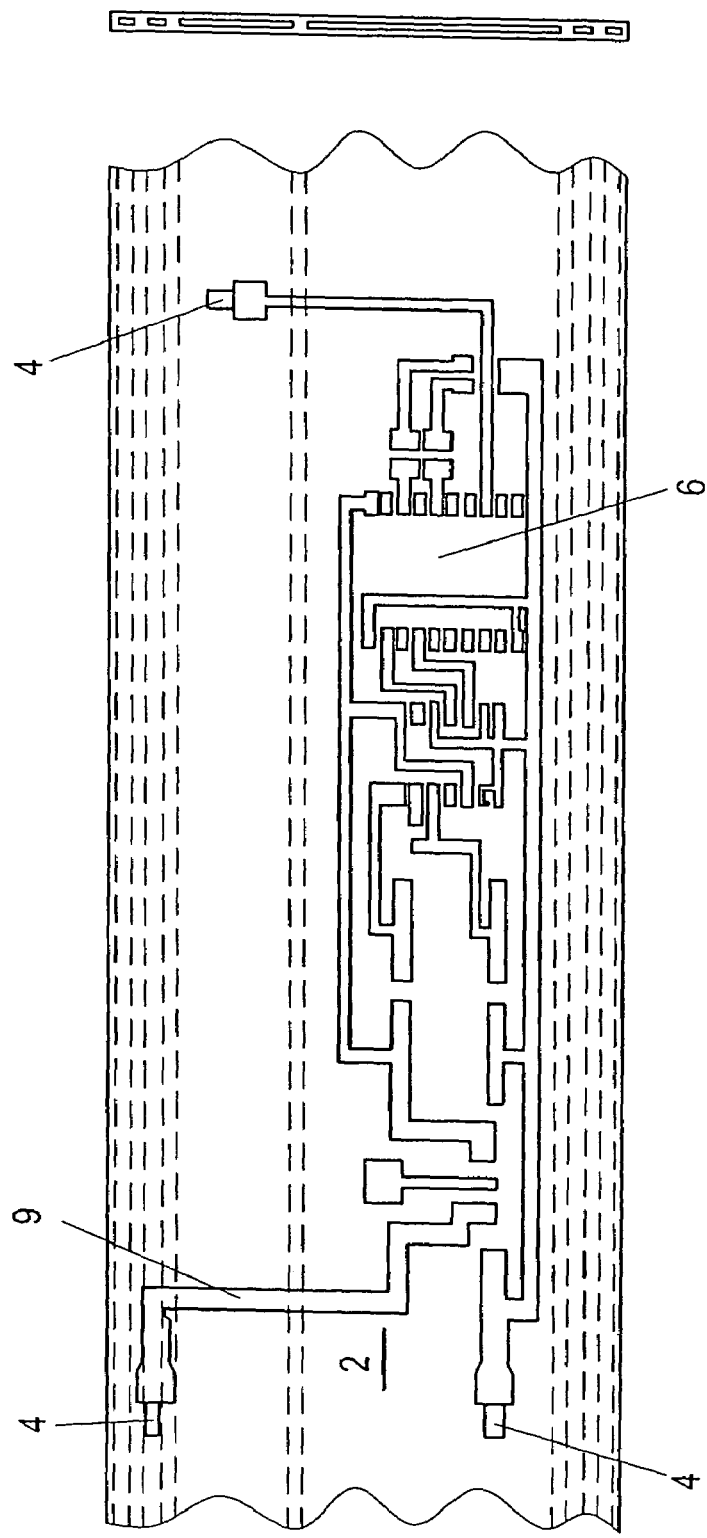
Figure 5A:
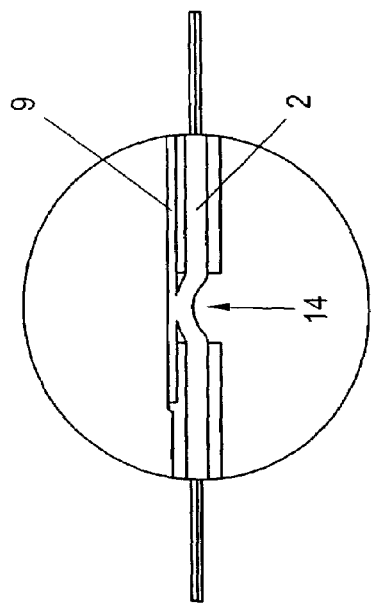
Figure 5B:
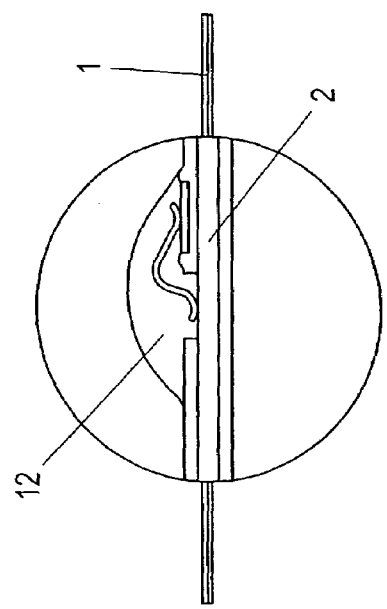
Figure 6:
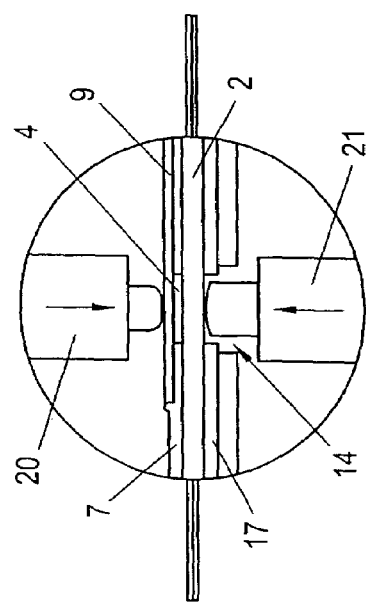
Figure 7:
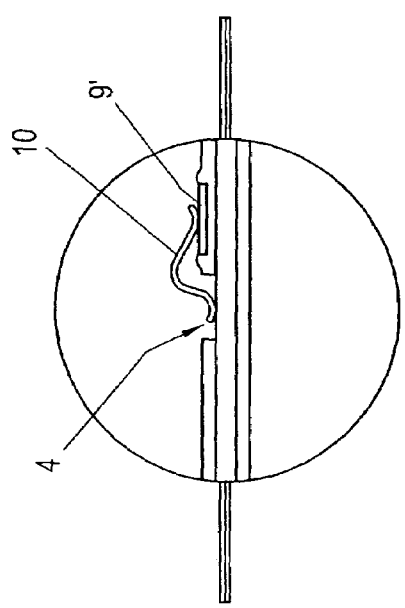
Figure 8:
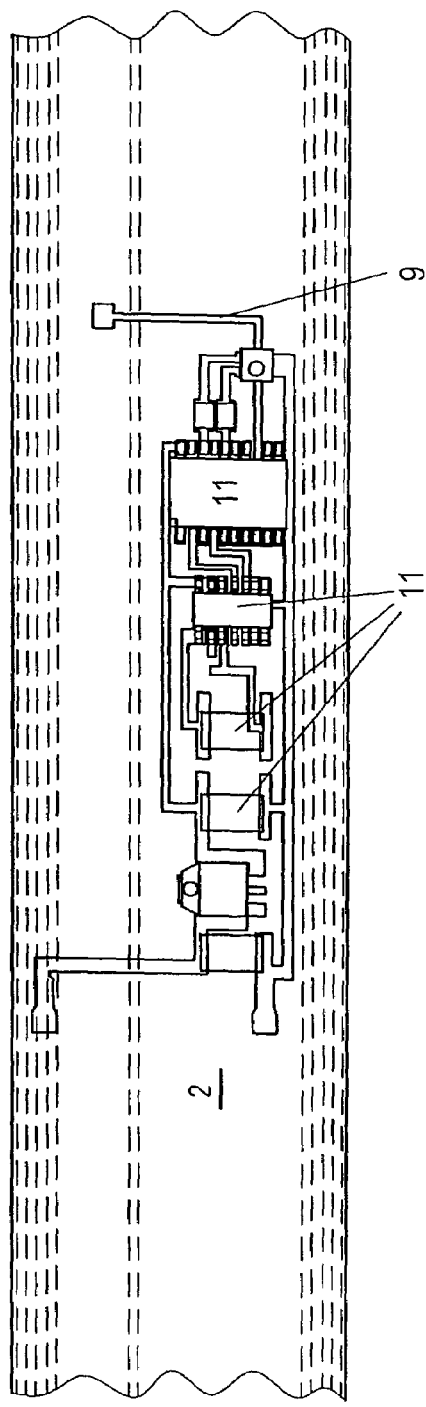
Figure 9:
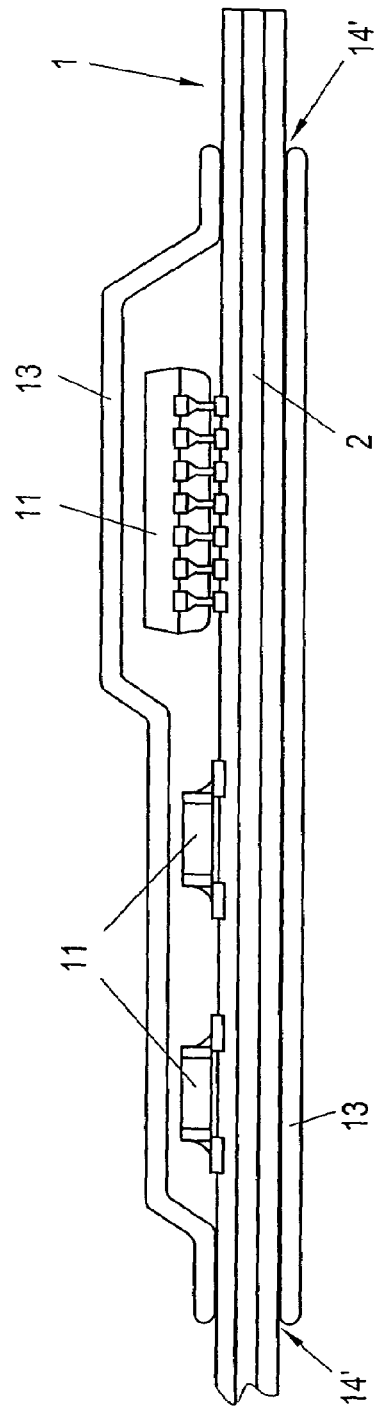
Figure 10A:
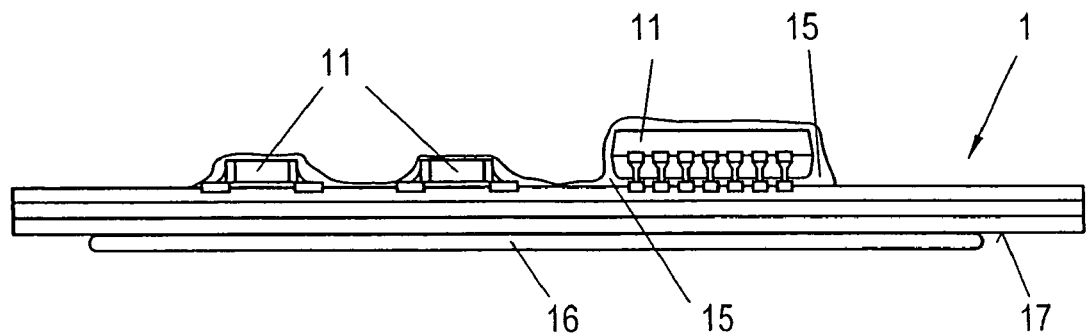
Figure 10B:
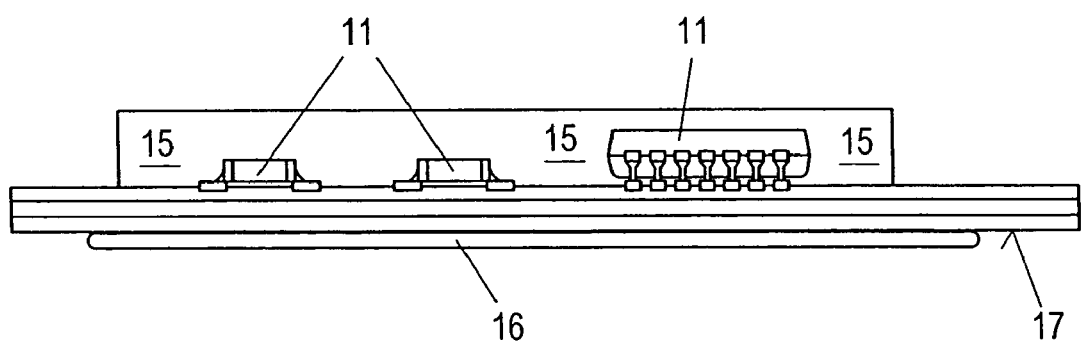
Figure 11:
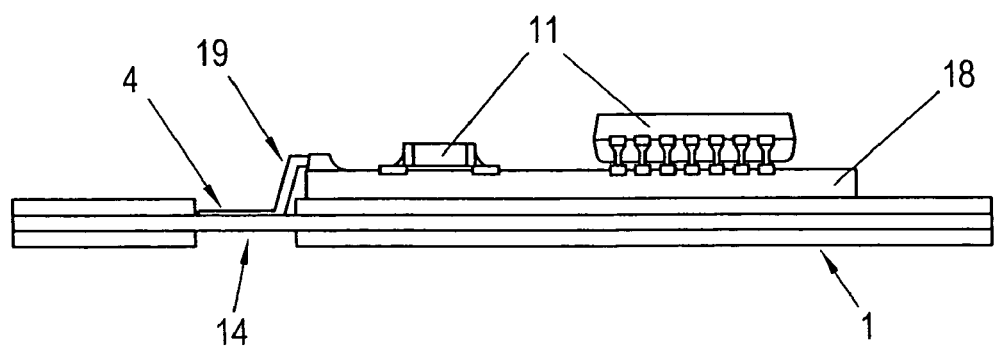
Figure 12:
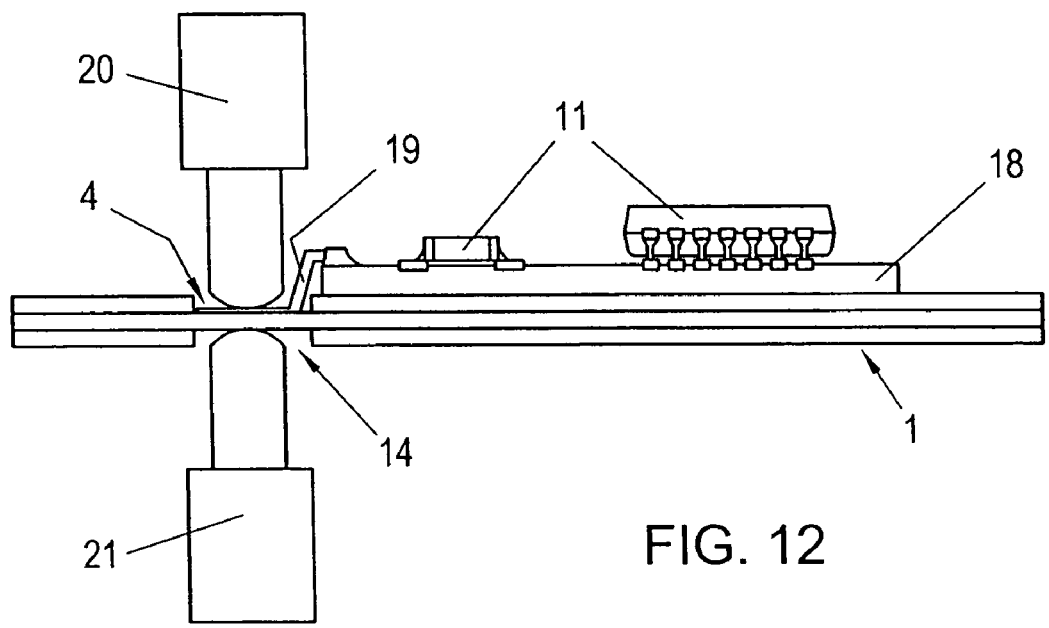
Figure 13:
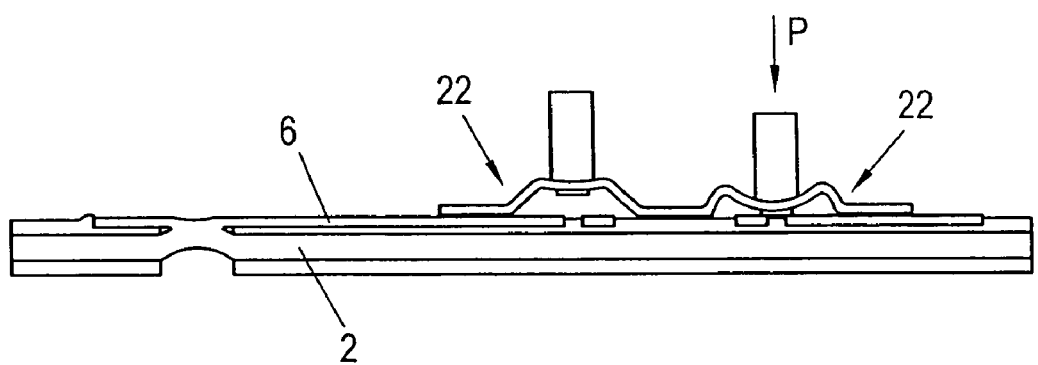
Figure 14:
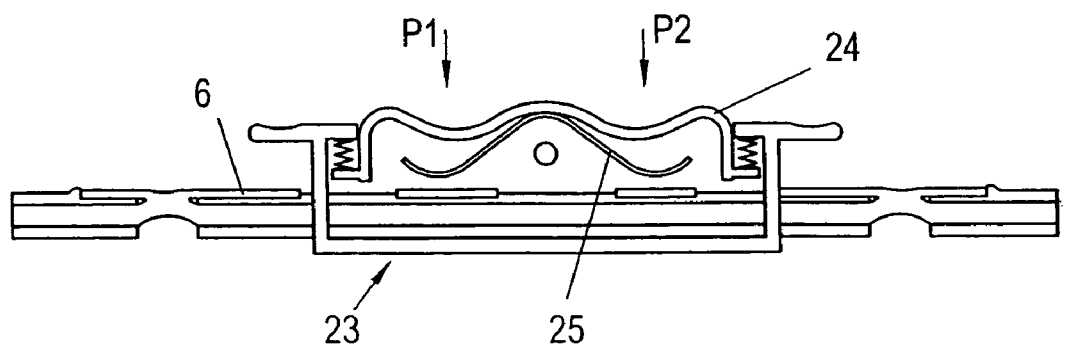

The invention is described in greater detail below with reference to the figures. The figures show:

FIG. 1, a top view and a section through an FFC with windows;

FIG. 2, a top view and a section according to FIG. 1 after the application of a stamped strip conductor pattern;

FIG. 3, a section along the line III—III in FIG. 2, however, with attached stamping die;

FIG. 4, a variation in the form of a top view and a section analogous to FIG. 2;

FIG. 5, two representations of the detail V in FIG. 2, wherein FIG. 5a shows the manufacture and FIG. 5b shows the finished connection;

FIG. 6, the detail VI in FIG. 4 in the form of a representation similar to that in FIG. 5b;

FIG. 7, a variation of the mechanical protection of a bonding point according to FIG. 6;

FIG. 8, the flat conductor according to FIG. 2 or FIG. 4 after it is fitted with electronic components;

FIG. 9, a side view of the flat conductor according to FIG. 8 after it is equipped with a mechanical protective housing;

FIG. 10, a flat conductor similar to FIG. 9, however, with an encapsulation that is produced with open casting in FIG. 10a and with mold casting in FIG. 10b;

FIG. 11, a variation of the invention, in which a fitted circuit board is attached to the flat conductor;

FIG. 12, one contacting option for the variation according to FIG. 11, namely in the form of a contact produced by means of resistance welding;

FIG. 13, a schematic representation of the arrangement of a push button on an FFC, and FIG. 14, a schematic representation of the arrangement of a switch on an FFC.

In the following description, the strip conductors of the FFC are referred to as "conductors 2" in order to semantically distinguish these strip conductors from the "strip conductors 6" that, according to the invention, are applied on the insulating layer. With the exception of hatchings and "specified" sections, the figures show purely schematic representations in order to provide a better overview.

According to FIG. 1, windows 4 are arranged in the insulation of an FFC 1, namely in the region of its conductors 2 that are spaced apart from one another by a distance 3. In a first variation, these windows 4 are arranged in an aligned fashion in the upper insulating layer 7 and in the lower insulating layer 17 so as to suitably expose the corresponding conductor 2.

FIGS. 2 and 3 show how the strip conductor pattern is transferred from a stamping foil 8, inserted between the upper insulating layer 7 and a stamping die 5, to the upper insulating layer 7 via the heated stamping die 5, which carries the raised contour of the desired pattern of strip conductors 6 and is pressed against the insulating layer.

According to FIG. 2, the strip conductor 6 may extend over the windows 4 such that direct contact can be produced between the strip conductor pattern 9 and the conductors 2 of the FFC. However, this may lead to mechanical problems in the region of each window 4, in which the strip conductor 6 is applied in an "overhanging" fashion. According to the alternative variation shown in FIG. 4 and FIG. 6, the strip conductor pattern 9 extends into the vicinity of the windows 4, and the electric connections with the conductors 2 are then respectively produced with a so-called wire bond 10.

FIG. 6, in particular, shows that the wire bonding connection only requires windows 4 on one side of the cable. In the direct connection that is preferably produced by means of resistance welding (FIG. 5a), the conductor 2 also must be accessible from the underside through a window 14 in the lower insulating layer 17 so as to enable the electrode of the welding apparatus to contact the conductor 2.

Casting resin is preferably utilized for protecting the connecting regions around the windows 4, 14. This is illustrated in FIG. 7 as an example of a wire bond connection. A person skilled in the art is easily able to determine how to proceed when a direct connection between the conductor 2 and the strip conductor 6 according to FIG. 5b must be produced. Consequently, this variation is not described in greater detail.

Subsequently, the FFC can be fitted with discrete electronic components by means of conventional automatic placement machines, e.g., as shown in FIG. 8. The individual electronic components 11 are suitably placed and bonded.

FIG. 9 shows one option for covering the electronic components 11 in order to protect the components from mechanical damage and, if so required, to provide a shield from electromagnetic influences. A rigid or conditionally flexible cover 13, the geometry of which is adapted to the respective electronic circuit to be covered, is positioned above and underneath the FCC 1 at a suitable location, wherein the cover is realized integrally with a hinge-like joint and, for example, closed by means of clips or hook-shaped elements. The cover is then permanently fixed in position, if applicable, with an adhesive that simultaneously seals the edges and the contact region with the FFC 1 against the admission of moisture. The arrangement of such adhesives or sealing compounds is indicated with the reference symbol 14', wherein the housing shell (without hatching, but in the form of a schematic section) 13 is realized integrally.

With respect to the manufacture and installation of such a housing, it is naturally also possible and, if applicable, even more favorable to utilize a housing that consists of two parts. In this case, an essentially planar lower part is connected to the upper part 13, for example, by means of mushroom-shaped projections that are pressed into corresponding recesses in the counterpart and fixed therein by means of a frictional connection or an elastic deformation. The housing can also be fixed and sealed relative to the FFC 1 with an adhesive or a sealing compound in this case, wherein the seal between the two housing parts is preferably produced simultaneously with the same materials. If sufficient space is available on the FFC, the housing shell 13 naturally may also be fixed on the FFC by means of a recess in the form of a hole. However, it usually must be assumed that sufficient space between the active conductors 2 is not available on an FFC.

FIG. 10 shows two variations in which a casting compound is used instead of a housing. FIG. 10a shows the so-called open casting method and FIG. 10b shows the so-called mold casting method. A detailed description of this figure is not provided because a person skilled in the field of electronic components is familiar with the differences between these two variations and can easily select the appropriate casting compound depending on the requirements to be fulfilled and the intended use. However, it should be mentioned that a stabilizing plate is used instead of the lower housing part, wherein said stabilizing plate is suitably fixed on the underside 17 of the FFC 1, for example, by means of an adhesive or a double-sided adhesive tape.

FIG. 11 shows a variation that is particularly suitable for more complex electronic circuits 11, as well as for instances in which a finished solution for the required circuit already exists on a conventional printed circuit board. In this case, a complete electronic circuit 11 is arranged on a printed circuit board 18 which is then suitably bonded to the FFC 1. It must be observed that the connecting elements 19 of the printed circuit board 18 are correspondingly positioned relative to the windows 4 of the FFC 1. FIG. 12 schematically shows that the electrical and mechanical connection is subsequently produced by means of resistance welding with the welding electrodes 20, 21. Although this is not illustrated in the figure, the connection may then be provided with mechanical protection, for example, a casting resin that is applied analogously to the embodiment described above with reference to FIG. 7.

Naturally, it is also possible to mechanically protect the circuit 11 arranged on the printed circuit board 18 with a housing or casting resin analogous to the embodiments according to FIGS. 9 and 10. A person skilled in the art is easily able to determine whether such mechanical protection is required or not.

FIG. 13 shows that it is also possible to easily fix, for example, a push button directly on a FFC 1. This merely requires the mounting of a suitable elastic push button 22 on the stamped strip conductors 6. This push button may, for example, consist of a commercially available rubber switching element 7 that presses against two adjacent and otherwise electrically isolated strip conductor regions 6 such that an electrical connection is produced when pressure is exerted upon the conductive part of its plunger.

FIG. 14 shows the arrangement of a switch in a housing that overlaps the FFC 1. The switch 23 consists of a conventional switch that, however, is adapted to the respective function and realized in the form of a rocker switch 24 for pivoting a conductive contact bridge 25 between two different positions. Two sections of the strip conductors 6 are electrically connected to and disconnected from one another depending on the respective position.

The invention can be modified in different ways because it is not limited to the illustrated and described embodiments. For example, it would be possible to replace the printed circuit board 18 with an elastic film conductor of the type frequently utilized in modern automobiles. In addition to allowing a separate manufacture of the FFC, the advantages of the invention with respect to direct contacting and small space requirement are simultaneously achieved in this case. In addition, mechanical deformability is also preserved.

It is also possible to realize different contacting variations. In addition to resistance welding, it would also be conceivable to utilize conductive bonding and other techniques. The invention is based on the notion of directly or indirectly utilizing the FFC as a carrier for active or passive electronic components or switching elements. Consequently, the realization and design of the mechanical and electrical connections, the covers and the casting process represent less important aspects of the invention.

In practical applications, at least two contacts are usually provided between the layout and the strip conductors of the FCC, namely because the ground connections in modern automobiles are increasingly realized via separate strip conductors rather than sheet metal parts of the car body. However, the invention naturally is also suitable for use in "conventional" cable harness structures.

The invention claimed is:

1. Flat flex cable, or FFC, in particular for use in vehicles, wherein said cable contains at least two electric conductors (2) that are embedded in at least one insulating layer (3) of a plastic material, characterized by the fact that a circuit layout (6) is applied on the surface of an insulating layer of the flat flex cable (1) and connected to at least one conductor (2) of the cable, and by the fact that at least one electric and/or electronic component (11) is arranged on the circuit layout (6).

2. Flat flex cable according to claim 1, wherein the circuit layout (6) consists of a copper foil with low transverse strength.

3. Flat flex cable according to claim 1, wherein the electronic components (11) are connected to the circuit layout (6) by means of conductive bonding.

4. Flat flex cable according to claim 1, wherein the electronic components (11) are covered with housing shells (13) or by means of selective casting (15) or a protective lacquer.

5. Flat flex cable according to claim 2, wherein the copper foil has a so-called cauliflower structure and/or is provided with a black oxide coating on the side that faces the flat flex cable.

6. Flat flex cable according to claim 1, wherein the electrically conductive connection between the circuit layout (6,9) and the at least one strip conductor (2) of the flat conductor is produced by means of resistance welding.

7. Flat flex cable according to claim 4, wherein the protective lacquer comprises a hardenable polymer system.

* * * * *